US011486929B1

(12) United States Patent
Curtis (10) Patent No.: US 11,486,929 B1
(45) Date of Patent: *Nov. 1, 2022

(54) SELF CONFIGURING RELAY TESTER

(71) Applicant: Kevin Curtis, Locust, NC (US)

(72) Inventor: Kevin Curtis, Locust, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/232,874

(22) Filed: Apr. 16, 2021

Related U.S. Application Data

(63) Continuation-in-part of application No. 16/440,872, filed on Jun. 13, 2019, now Pat. No. 11,016,148.

(60) Provisional application No. 62/765,633, filed on Sep. 4, 2018.

(51) Int. Cl.
| | |
|---|---|
| G01R 31/327 | (2006.01) |
| H01H 50/14 | (2006.01) |
| H01H 50/08 | (2006.01) |
| H01H 50/18 | (2006.01) |
| H01H 50/44 | (2006.01) |

(52) U.S. Cl.
CPC ......... *G01R 31/3278* (2013.01); *H01H 50/08* (2013.01); *H01H 50/14* (2013.01); *H01H 50/18* (2013.01); *H01H 50/44* (2013.01)

(58) Field of Classification Search
CPC .... G01R 31/3278; H01H 50/08; H01H 50/14; H01H 50/18; H01H 50/44
See application file for complete search history.

(56) References Cited

U.S. PATENT DOCUMENTS

| | | | | |
|---|---|---|---|---|
| 3,847,283 | A * | 11/1974 | Squires | B07C 5/344 209/555 |
| 8,344,737 | B2 * | 1/2013 | Watson | G01R 31/3278 324/555 |
| 9,423,462 | B1 * | 8/2016 | Curtis | G01R 31/3278 |
| 2003/0132752 | A1 * | 7/2003 | Johnson | G01R 31/3278 324/418 |
| 2004/0085071 | A1 * | 5/2004 | Sankey | G01R 31/3278 324/418 |
| 2018/0143251 | A1 * | 5/2018 | Tili | G01R 31/3278 |

* cited by examiner

*Primary Examiner* — Tung X Nguyen
*Assistant Examiner* — Feba Pothen
(74) *Attorney, Agent, or Firm* — QuickPatents, LLC; Kevin Prince (57) ABSTRACT

A tester for a relay comprises an enclosure, a testing circuit that includes a controller, electronic switch components, a power source, indicator LEDs, a test start switch, a relay selector switch, and five electric leads each connected with one terminal of the relay. With the relay selector switch toggled to indicate the type of relay being tested, with power supplied to each lead, and with the test start switch actuated, the controller sets each lead to ground, in turn, and then count the number of other leads that are grounded as a result. The controller then illuminates the at least one indicator to indicate either the passing relay test or the failed relay test based on the counts measured. Once the leads connected to the relay coil are identified, cyclic testing of the relay can be performed.

10 Claims, 6 Drawing Sheets

SELF CONFIGURING RELAY TESTER

CROSS-REFERENCE TO RELATED APPLICATIONS

This application is a Continuation-in-Part of U.S. patent application Ser. No. 16/440,872, filed on Jun. 13, 2019, which itself claimed the benefit of U.S. Provisional Patent Application 62/765,633, filed on Sep. 4, 2018, both incorporated herein by reference.

STATEMENT REGARDING FEDERALLY SPONSORED RESEARCH AND DEVELOPMENT

Not Applicable.

FIELD OF THE INVENTION

This invention relates to testing equipment for electronic components, and more particularly to a self-configuring relay tester.

BACKGROUND

Relays are mechanical devices that are in use in several types of equipment, automobiles, and the like, that makes it possible for a small power signal to control a relatively larger power load. For example, in an automobile circuit a relay is often used to control the headlamp circuit. The light switch that is operated by an automobile driver is connected to the input or coil side of the relay. This input side requires a relatively small amount of power from the light switch circuit. When the headlamp switch is switched to the on position, power is applied to the coil causing a magnetic field to be created about the coil's longitudinal axis which in turn attracts the ferrous metal pole piece of the output side of the relay causing the contacts to change state, which causes the headlamp circuit to close, thereby applying power to the relatively high power headlamp circuit. In effect, the relatively small power drawn from the headlamp switch circuit controls the larger power that is delivered to the headlamp circuit. This type of configuration is used throughout industry and all different types of electrical/electronic controls for equipment, automobiles, implements, automation equipment and just about any device that requires some type of moderate power controls.

Every electrical or electronic circuit that contains a relay poses the problem of testing to determine the cause of a fault, especially when a circuit having trouble is of the automotive type such that there is no access to test points that can be checked while the circuit is in operation or "live". All relay circuits consist of a control (coil) and a load side. All relays contain a coil that are energized by a control circuit which in turn causes the relay to operate at least one mechanical contact, causing a connected load circuit to be energized or de-energized by the operation of the mechanical contact. When a circuit of this type develops a problem, it becomes necessary to check the voltages and currents at different locations within the circuit in order to determine the cause of the problem. If there happens to be test points in the circuit that can be easily accessed, then a voltmeter and ammeter (digital multimeter—DMM) may be used to display the electrical quantities of the circuit. The disadvantage of using a DMM is that it is time consuming and particularly difficult to take the current readings in the live circuit. A DMM is also incapable of making automatic measurements of a relay in order to determine whether or not the relay itself might be malfunctioning and the cause of the circuit fault.

Currently there are relay testers on the market that perform automatic relay testing. My "Relay Buddy™," U.S. Pat. No. 9,423,462, is the best example. The present invention is an improvement upon this type of device because of the interface that is created between the relay-under-test (RUT) and the relay tester itself.

The relay testers that are now on the market all contain a few common relay sockets, so that the RUT can simply be placed into the appropriate socket, thus exposing the electrical components of the RUT to the proper locations of the testing circuitry in the relay tester. For these type of relay testers there is a requirement that the RUT be able to fit into a specific relay socket to be tested. The Relay Buddy™ comes standard with 3 specific types of relay sockets or "footprints" of terminal layouts that can be tested. The Relay Buddy™ also comes with other relay footprint adapters that allows a few other types of relays to be tested by aligning the RUT terminal to the proper testing socket terminals. All objects of the prior art devices contain a fixture or fixtures that allow the RUT to be connected to the relay tester in a controlled, known and repeatable method. This is the real limitation of this current type of relay tester. The only relays that may be tested must be able to fit into the proper footprint of that offered on the tester or they must have an adapter that will allow the relay to fit into the proper terminal locations.

All relays contain a coil that is energized to create a magnetic field that in turn pulls an armature or pole piece of the relay switch to move, resulting in an electrical connection being closed or opened. When the power that was used to energize the relay is removed, the magnetic field will be lost and the armature will return back to its original position under some type of spring force, and again create the original "deenergized" or "normal" state of electrical connections. As such, all relays contain a coil side, and a switch side. Most all of the modern automotive type relays contain a common "footprint" that causes the components of the relay to be properly and repeatably positioned whenever it is placed into the circuit. Automobiles and most other equipment that use relays contain "Sockets" that allow for a common and properly-configured attachment point of the relay into the circuit.

Further, all relays contain a coil and a switch, but there are many different types of "footprints" or configurations that expose those common elements of the relay. Depending on the amount of electrical current that the relay is designed to handle, it may contain relatively large terminals that expose the switch side of the circuit. Some relays that are designed to carry over 100 Amperes often have switch connection that utilize large round screw terminals.

Modern relays do not have a strict wiring standard that causes terminal designation/sizes to be a common, known location or function. In order for the relay to be successfully tested, there must be an adapter that will cause the proper relay terminals to be connected properly to the tester in order for the tester to know which terminal is which.

Therefore, there is a need for a relay testing device that can be quickly connected to a relay without regard to knowing what each terminal of the relay is. The needed invention would have easy-to-use and intuitive controls, and would quickly test either 4-terminal or 5-terminal relays, giving a clear indication when such a relay successfully passes or fails the testing. The needed device would switch between, say, 12V and 24V automatically based on a voltage level detected in the external power source. The present invention would be relatively easy to use with either a vehicle battery or an on-board battery. The present invention accomplishes these objectives.

SUMMARY OF THE INVENTION

The present device is a tester for a relay of the type having either four or five electric terminals two of the electric terminals, being coil terminals, connected at opposing sides of a relay coil, either a single normally-open terminal or a single normally-closed terminal, or both the normally-open terminal and the normally-closed terminal, and an armature terminal electrically connected with a conductive relay armature that connects with the normally-closed terminal, if present, when the coil is in a deenergized state, or the normally-open terminal when the coil is in an energized state. Such a relay is either a -terminal normally-open relay, a -terminal normally-closed relay, or a -terminal relay having both a normally-open terminal and a normally-closed terminal, typically used in vehicles (not shown).

The testing device comprises an enclosure, and a circuit board fixed at least partially within the enclosure. The circuit board includes a testing circuit that includes a controller, two or more electronic switch components, a power source, at least one indicator, a test start switch, a relay selector switch, at least five voltage dividers, at least five analog-to-digital converters, and five electric leads each terminating at a distal end thereof with an electrically-conducting clip.

The power source is, in one embodiment, a battery or the like, contained in the enclosure. Alternately the power source is an external power source such as a vehicle battery having a positive power lead and a negative power lead, each connected with the testing circuit to power the testing circuit and the relay coil.

In some embodiments the at least indicator includes a green LED to indicate a passing relay test, as well as a red LED to indicate a failed relay test. In some embodiments the at least one indicator includes a 4-terminal LED and a 5-terminal LED, the relay selector switch toggling between illuminating each such LED to indicate what type of relay is to be tested.

The controller is adapted to perform a quick count of the number of the electric leads that are grounded as a result of setting one of the leads to ground before the relay can change state, due to a "pull-in time lag" of the relay wherein the armature doesn't move immediately upon change of state of the relay coil. The controller is also adapted to perform an alternate slow count of the number of the electric leads that are grounded as a result of setting one of the leads to ground, waiting until after an armature movement time once the relay has changed state.

Preferably the testing circuit further includes a voltage regulator for providing a component voltage, such as volts, to the testing circuit when the power source is a higher voltage than the component voltage. A diode bridge may also be used to correct the polarity of the component voltage if the power leads are inadvertently connected with the wrong side of the external power source. In preferred embodiments, resistors values are set to accommodate the external power source having a voltage of between 12 volts and 24 volts.

Preferably the controller is adapted to run a predefined number, such as ten, cyclic relay test, once the controller has determined which of the electric leads are connected with the relay coil. As such, the controller illuminates the green LED if each of the cyclic relay test are passed, or the red LED if any of the cyclic relay test are failed.

In use, with each electrical terminal of the relay connected to one of the leads of the testing circuit, and with the relay selector switch set to indicate the type of relay being tested, and with the test start switch actuated, the controller can set each electric lead to ground, in turn, and then count the number of other leads that are grounded as a result. The controller then illuminates the at least one indicator to indicate either the passing relay test or the failed relay test based on the counts measured.

With a 5-terminal type relay, and with the relay deenergized, the testing circuit first determines which of the five leads are connected with substantially zero resistance, and then designates these as the normally closed leads. Then the testing circuit grounds each other lead in turn to see when the normally-closed leads are opened, with essentially infinite resistance. This indicates that at least one of the coil leads has been found. Once one of the coil leads is determined then the coil can be cycled in a cyclic relay test to identify the other leads and to test the relay, typically through ten cycles. If any of the tests fail the red LED is illuminated to indicate a failed relay test; otherwise the green LED is illuminated to indicate a passing test.

The present invention is a relay testing device that can be quickly connected to a relay without regard to knowing what each terminal of the relay is. The needed invention would have easy-to-use and intuitive controls, and would quickly test either 4-terminal or 5-terminal relays, giving a clear indication when such a relay successfully passes or fails the testing. The needed device would switch between voltage levels automatically based on a voltage level detected in the external power source. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list. When the word "each" is used to refer to an element that was previously introduced as being at least one in number, the word "each" does not necessarily imply a plurality of the elements, but can also mean a singular element.

Figure 1:
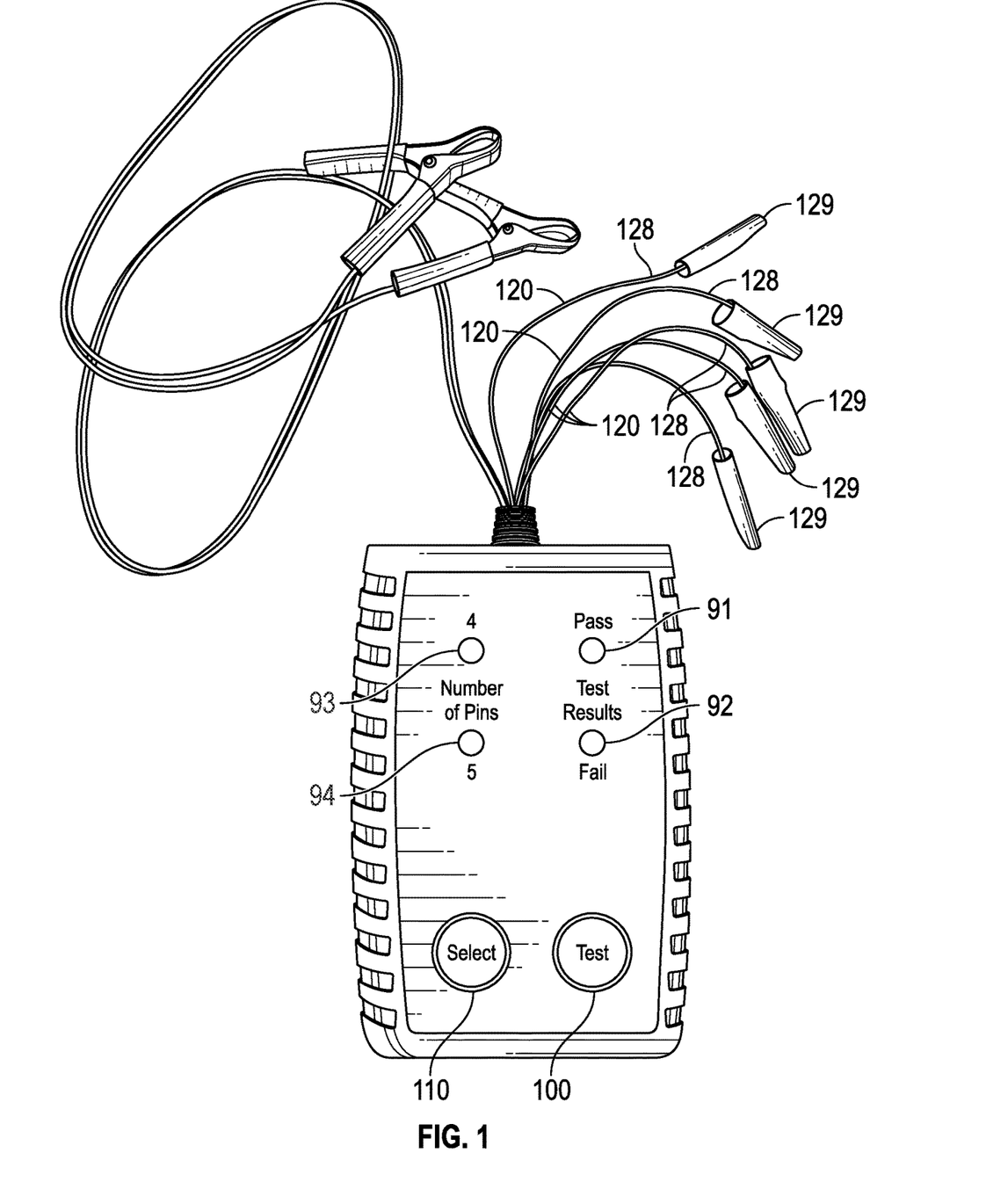
FIG. 1 is a perspective view of the invention.
Figure 2:
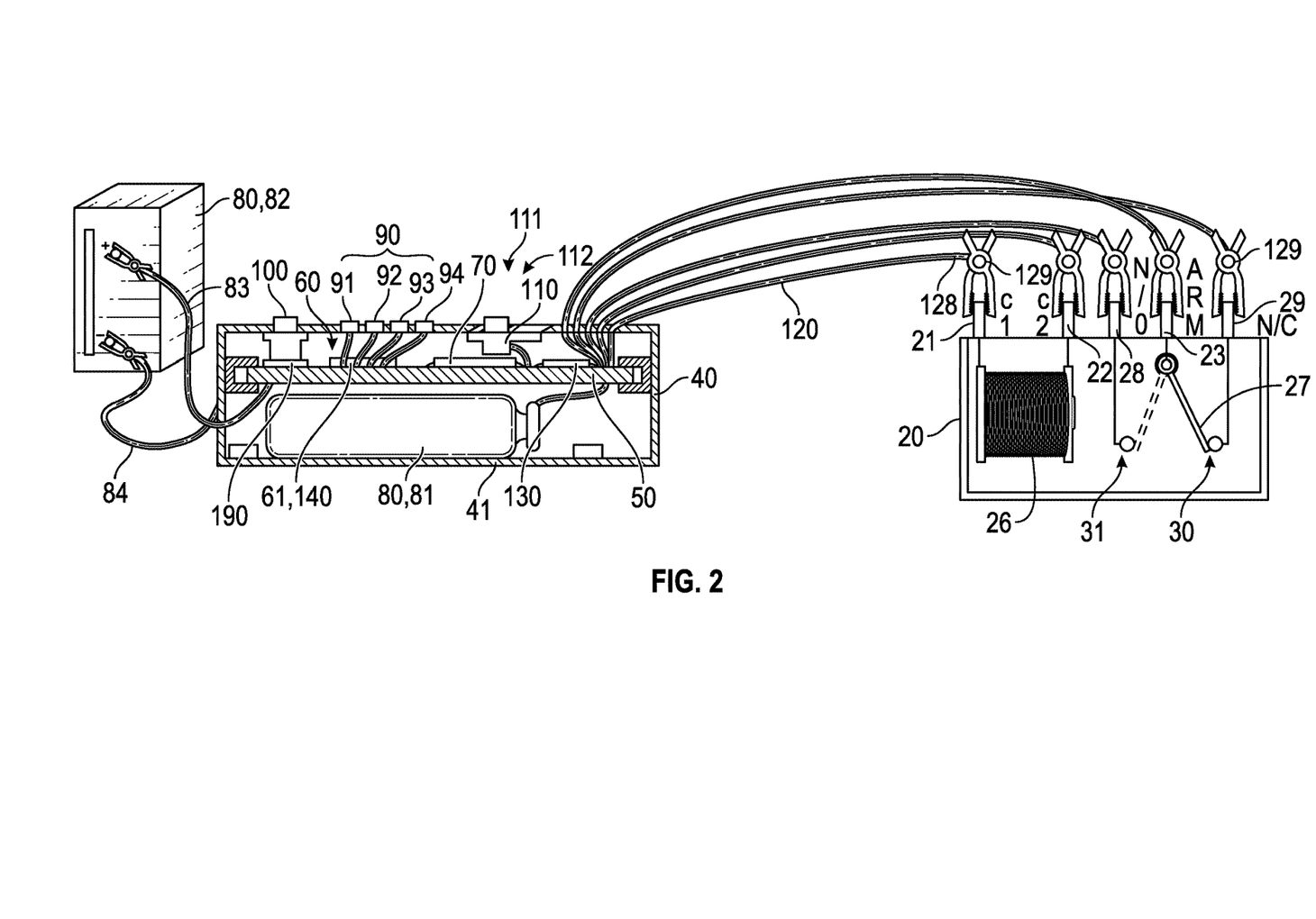
FIG. 2 is a cross-sectional view of the invention as electrically connected with a relay to be tested.

FIGS. 1 and 2 illustrate a testing device 10 for a relay 20 of the type having either four or five electric terminals 21,22,23,28,29, two of the electric terminals 21,22 being coil terminals 21,22 connected at opposing sides of a relay coil 26, either a single normally-open terminal 28 or a single normally-closed terminal 29, or both the normally-open terminal 28 and the normally-closed terminal 29, and an armature terminal 23 electrically connected with a conductive relay armature 27 that connects with the normally-closed terminal 29, if present, when the coil 26 is in a deenergized state 30, or the normally-open terminal 28 when the coil 26 is in an energized state 31. Such a relay 20 is either a 4-terminal normally-open relay 20, a 4-terminal normally-closed relay 20, or a 5-terminal relay 20 having both a normally-open terminal 28 and a normally-closed terminal 29, typically used in vehicles (not shown).

The testing device 10 comprises an enclosure 40, and a circuit board 50 fixed at least partially within the enclosure 40. The circuit board 50 includes a testing circuit 60 that includes a controller 61, two or more electronic switch components 70, a power source 80, at least one indicator 90, a test start switch 100, a relay selector switch 110, at least five voltage dividers 130, at least five analog-to-digital converters 140, and five electric leads 120 each terminating at a distal end 128 thereof with an electrically-conducting clip 129.

The enclosure 10 is preferably made from a rigid or semi-rigid material, such as injection molded plastic, metal, wood, or the like. The controller 61 is preferably an MCU such as Microchip Technology's PIC16F18344 that can be programmed to perform testing steps, and that includes the at least five analog-to-digital converters 140. The electronic switch components 70 are preferably a transistor pack such as Texas Instrument's ULN2003A.

The power source 80 is, in one embodiment, a battery 81, an A/C adapter plugged into a 110V outlet, or the like, contained in the enclosure 40, the enclosure 40 being selectively sealable to retain the battery 81 therein with a removable door 41. Alternately the power source 80 is an external power source 82 having a positive power lead 83 and a negative power lead 84, each connected with the testing circuit 60 to power the testing circuit 60 and the relay coil 26. The external power source 82, such as a vehicle battery 82, and the relay 20 are preferably from the same vehicle, if testing a relay 20 designed for use with such a vehicle, so that a supply voltage Vs of the vehicle battery 82 is known to be safe for powering the vehicle relay 20.

In some embodiments the at least indicator 90 includes a green LED 91 to indicate a passing relay test 170, as well as a red LED 92 to indicate a failed relay test 180. In some embodiments the at least one indicator 90 includes a 4-terminal LED 93 to indicate a 4-terminal relay 20 is to be tested, as well as a 5-terminal LED 94 to indicate that a 5-terminal relay 20 is to be tested, the relay selector switch 110 toggling between the two LEDs 93,94 when closed. The test start switch 100 and the relay selector switch 110 are each preferably a momentary-contact normally-open type of button or switch 100.

The controller 61 is adapted to perform a quick count of the number of the electric leads 120 that are grounded as a result of setting one of the leads 120 to ground before the relay 20 can change state, due to a "pull-in time lag" of the relay 20 wherein the armature 27 doesn't move immediately upon change of state of the relay coil 26. The controller 61 is also adapted to perform an alternate slow count of the number of the electric leads 120 that are grounded as a result of setting one of the leads 120 to ground, waiting until after an armature movement time once the relay 20 has changed state.

Figure 3:
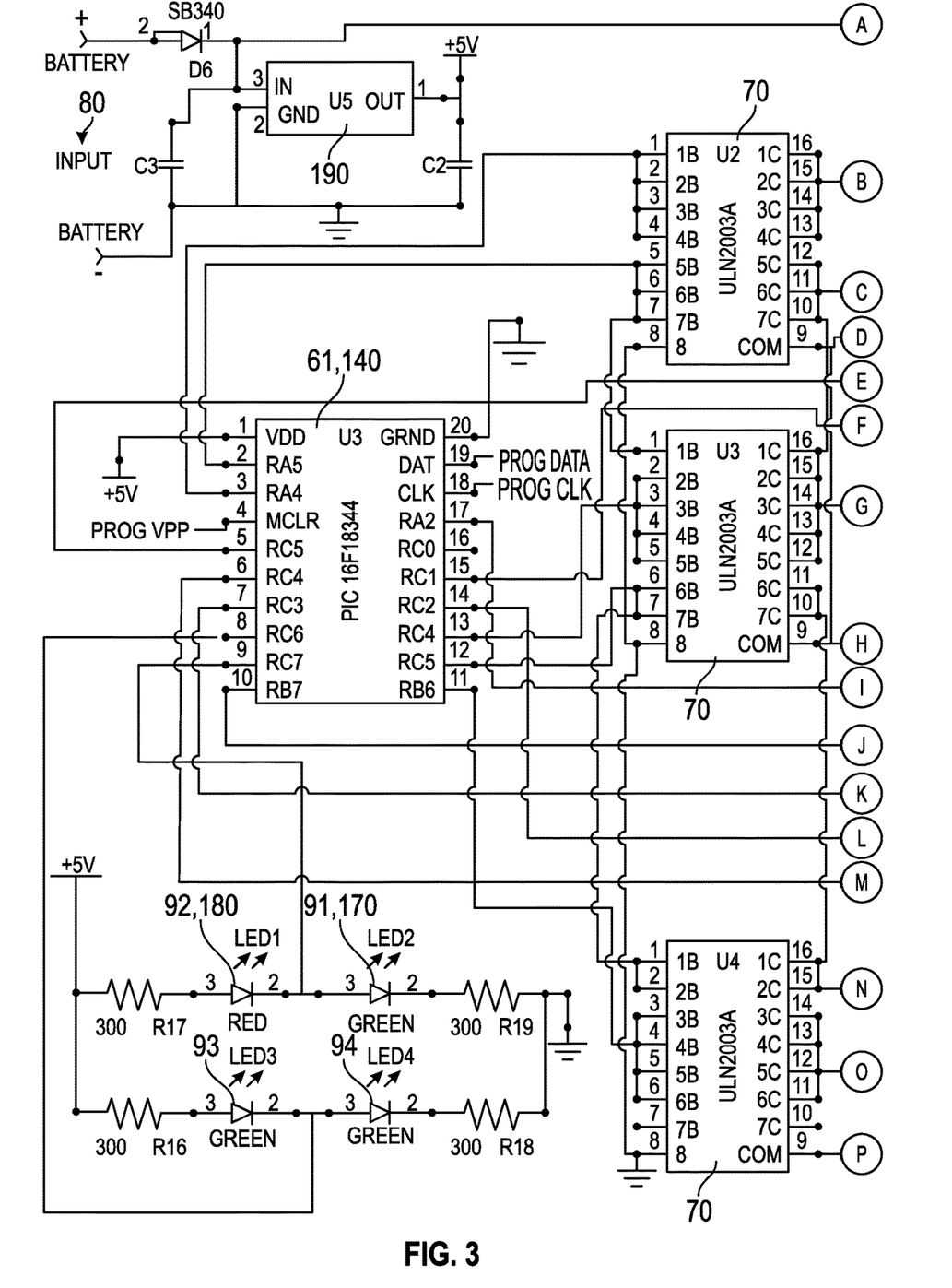
FIG. 3 is a schematic diagram of one embodiment of the invention.

Preferably the testing circuit 60 further includes a voltage regulator 190 (FIG. 3) for providing a component voltage $V_+$, such as 5 volts, to the testing circuit 60 when the power source 80 is a higher voltage than the component voltage $V_+$. A diode bridge (not shown) may also be added to correct the polarity of the component voltage if the power leads 83,84 are inadvertently connected with the wrong side of the external power source 82. Alternately, diode D6 can be included to simply prevent the testing circuit from working if the power leads 83,84 are inadvertently connected with the wrong side of the external power source 82. Preferably, resistors R1-R15 are set to accommodate the external power source 82 having a voltage of between 24 volts and 12 volts, or the like.

Preferably the controller 61 is adapted to run a predefined number, such as ten to check for intermittent failures, cyclic relay test 210, once the controller 61 has determined which of the electric leads 120 are connected with the relay coil 26. As such, the controller 61 illuminates the green LED 91 if each of the cyclic relay test 210 are passed, or the red LED 92 if any of the cyclic relay test 210 are failed.

In use, with each electrical terminal 21,22,23,28,29 of the relay 20 connected to one of the leads 120 of the testing circuit 60, and with the relay selector switch 110 set to the type of relay 20 being tested, and with the test start switch 100 actuated, the controller 61 can set each electric lead 120 to ground, in turn, and then count the number of other leads 120 that are grounded as a result. The controller 61 then illuminates the at least one indicator 90 to indicate either the passing relay test 170 or the failed relay test 180 based on the counts measured.

Figure 4:
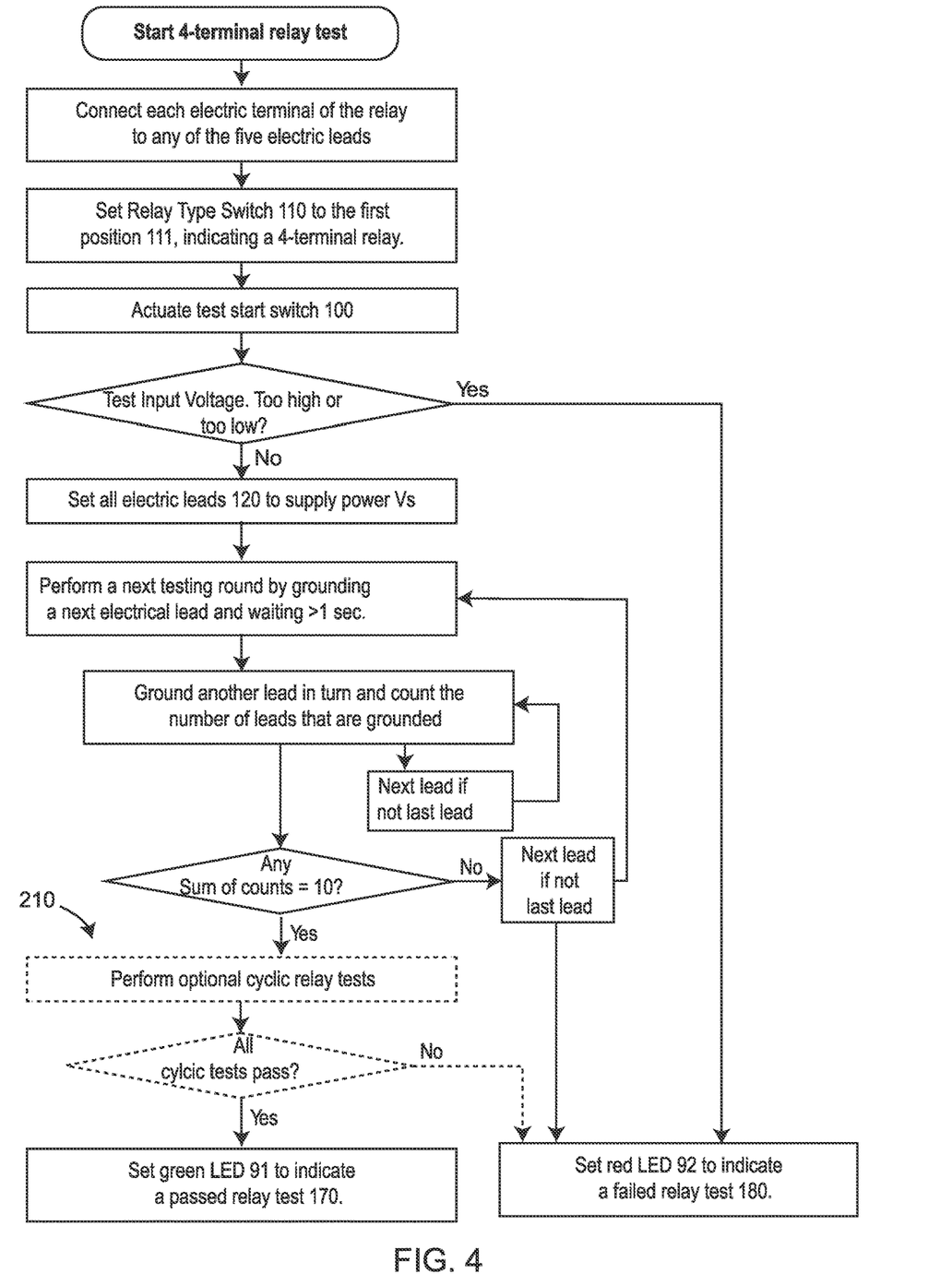
FIG. 4 is a flow chart showing a testing procedure of the invention for a 4-terminal relay.

Specifically, with a 4-terminal type relay 20, the following steps are taken to test the relay 20 (FIG. 4):

1. The testing device 10 as described above is provided.
2. Each electric terminal 21,22,23,28 of the relay 20 are connected to one of the five electric leads 120 of the testing circuit 60. It does not matter which of the four electric leads 120 is connected to each of the terminals 21,22,23,28, simplifying setting-up the relay test.
3. The relay selector switch 110 is toggled to indicate a 4-terminal type relay 20 is being tested.
4. The supply voltage Vs is applied to the testing circuit 60 whereby each of the leads 120 is connected with the supply voltage Vs.
5. The test start switch 100 is actuated.
6. The testing circuit 60 then tests to ensure that the voltage of the power source 80, and specifically the external power source 82 if such is connected with the testing circuit 60, is within a predetermined proper voltage range, such as about 12-15.5V. If not, the testing circuit 60 illuminates the at least one indicator 90 to indicate a voltage fault condition, such as by flashing the red LED 92 for example, and stops the test.

7. The testing circuit 60 then performs a first testing round by grounding a first electric lead 121 and waiting for at least a predetermined armature movement time, such as one second.
8. The testing circuit 60 then grounds each of the other electric leads 120 in turn and performs the quick count of the number of leads 120 that are grounded. The testing circuit 60 then adds each count to determine if the count is ten, and if so skips to step 10.
9. The testing circuit 60 then repeats from step 7 with a next testing round by grounding the next electrical lead 122, and so forth until all five of the electrical leads 120 have been so grounded.
10. If none of the testing rounds results in a count of ten, the testing circuit 60 sets the red LED 92 to indicate a failed relay test 180 and stops the test.
11. In some embodiments a cyclic relay test 210 is conducted at this point, which is explained below.
12. If reaching step 12, the testing circuit 60 sets the green LED 91 to indicate a passing relay test 170.

A properly functioning relay 20, with all terminals 21,22, 23,27,28 set to Vs will show the following results:

| Slow Test to Ground | Quick Test to Ground | Results | | | | | No Connection | Ground Count |
|---|---|---|---|---|---|---|---|---|
| | | Coil 1 | Coil 2 | Arm | N/O | N/C | | |
| lead connection | | 1 | 2 | 3 | 4 | — | 5 | |
| lead 1 to ground | | gnd | V+ | V+ | V+ | — | V+ | |
| | lead 2 | gnd | gnd | V+ | V+ | — | V+ | 2 |
| | lead 3 | gnd | V+ | gnd | gnd | — | V+ | 3 |
| | lead 4 | gnd | V+ | gnd | gnd | — | V+ | 3 |
| | lead 5 | gnd | V+ | V+ | V+ | — | gnd | 2 |
| | | | | | | | | Sum = 10 |

Anything other than a count of 10 indicates some type of failure in the relay 20.

The cyclic relay test 210 tests a predetermined number of cycles of energizing the relay 20 and then deenergizing the relay 20, measuring conductivity or resistance between the armature terminal 23, the normally-open terminal 28, and if present, the normally-closed terminal 29. The cyclic relay test 210 can only be performed once the electric leads 120 that are connected across the relay coil 26 have been determined. In the above steps, any testing round that results in a count of 10 ensures that the two grounded leads 120 are connected across the coil 26. As such, the conductivity or resistance between the armature terminal 23 and the normally-open terminal 28 can be tested when energizing and deenergizing the coil 26 and by setting the electric lead 120 corresponding to the armature terminal 23 to ground. Similarly the conductivity or resistance between the armature terminal 23 and the normally-closed terminal 29, if present, can be tested when energizing and deenergizing the coil 26 and by setting the electric lead 120 corresponding to the armature terminal 23 to ground. With the relay coil 26 in the energized state, initially the normally-open terminal 28 in a working relay 20 will be disconnected from the armature 27 and will show zero voltage drop, or substantially infinite resistance. Once the armature movement time has transpired and the relay 20 has changed state, the normally-open terminal 28 in a working relay 20 will be electrically connected with the armature 27 and will show a voltage drop of the supply voltage Vs, or substantially zero resistance. The relay 20 is energized and deenergized repeatedly, and the remaining leads 120 are tested accordingly, to ensure the relay 20 is functioning properly. If any of the cyclic relay tests 210 fail, the red LED 92 is illuminated and the testing is stopped. Otherwise the green LED 91 is illuminated to indicating a passing relay test 170.

With a 5-terminal type relay 20, the following steps test the relay 20 (FIG. 5):
1. The testing device 10 as described above is provided.
2. Each electric terminal 21,22,23,28,29 of the relay 20 are connected to one of the five electric leads 120 of the testing circuit 60. It does not matter which of the five electric leads 120 is connected to each of the terminals 21,22,23,28,29, simplifying setting-up the relay test.
3. The relay selector switch 110 is toggled to indicate a 5-terminal type of relay 20.
4. The supply voltage Vs is applied to the testing circuit 60 whereby each of the leads 120 is connected with the supply voltage Vs.
5. The test start switch 100 is actuated.
6. The testing circuit 60 then tests to ensure that the voltage of the power source 80, and specifically the external power source 82 if such is connected with the testing circuit 60, is within a predetermined proper voltage range, such as about 12-15.5V. If not, the testing circuit 60 illuminates the at least one indicator 90 to indicate a voltage fault condition, such as by flashing the red LED 92 for example, and stops the test.
7. The testing circuit 60 performs a normally-closed test by ground a first of the electric leads 120 and quickly counting the number of leads that are grounded. If the count is two, the controller 61 skips to step 10.
8. The normally-closed test is repeated with a next of the electric leads 120.
9. If all of the electric leads 120 have been grounded in the normally-closed test and none of the counts was two, the testing circuit 60 sets the red LED 92 to indicate a failed relay test 180 and the test is stopped.
10. The two electric leads that are found to be grounded in the normally-closed test are designated the normally-closed leads 23,29.
11. The testing circuit 60 now searches for the coil 26 by grounding the remaining three electric leads 120, in turn, that are not the normally-closed leads 23,29, testing to see if the normally-closed leads 23,29 are now open. If so the grounded lead is a coil lead 21,22, and if any of the two remaining leads 120 are connected to either of the normally closed leads 23,29, those two connected leads are the normally open leads 23,28. The common lead between the normally closed leads 23,29 and the normally open leads 23,28 is designated as the armature lead 23. The testing circuit 60 skips to step 13.
12. If the normally-closed leads 23,29 never open during step 11, the testing circuit 60 sets the red LED 92 to indicate a failed relay test 180 and the test is stopped.

Figure 5:
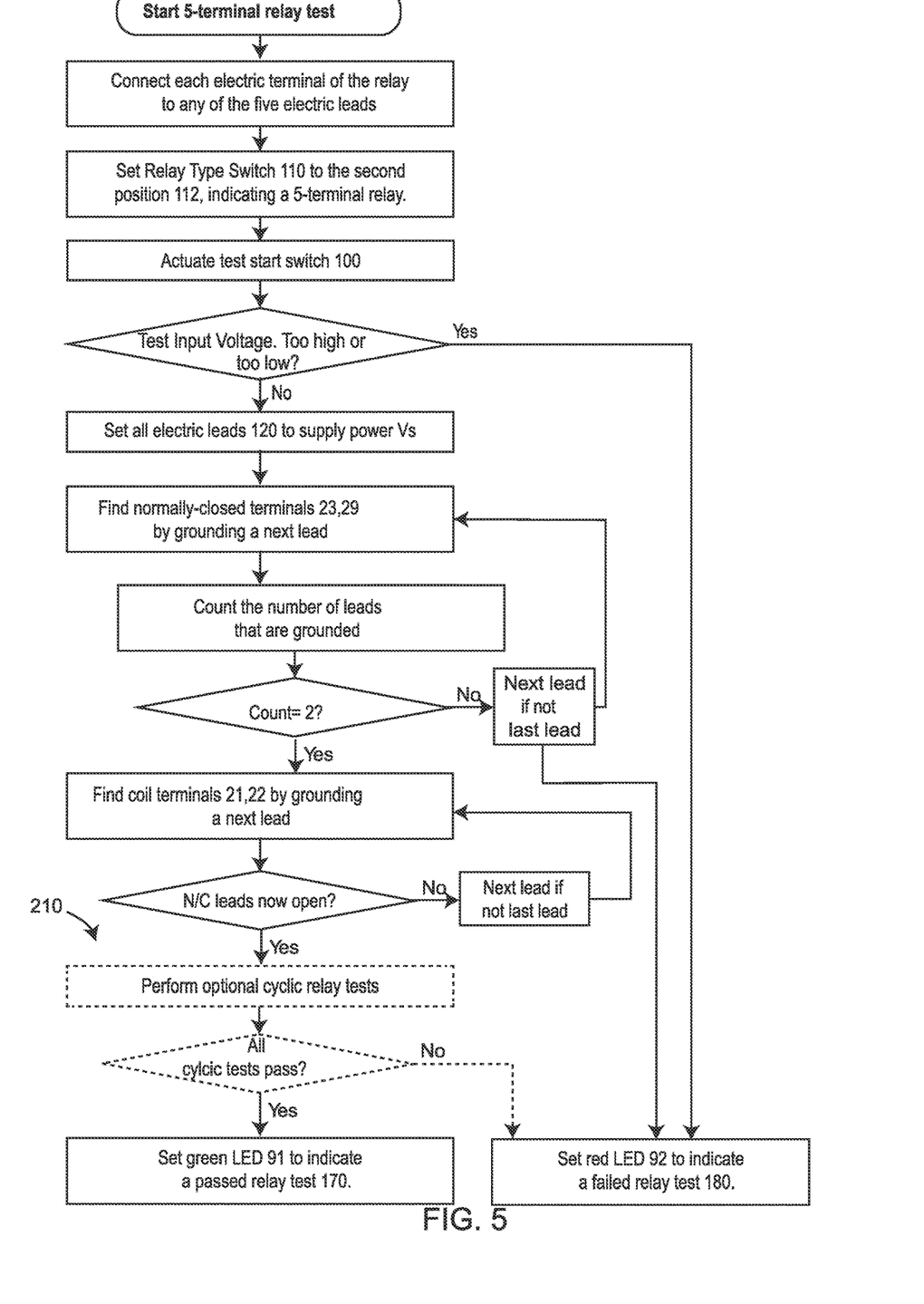
FIG. 5 is a flow chart showing a testing procedure of the invention for a 5-terminal relay.

13. In some embodiments a cyclic relay test 210 is conducted at this point, as previously explained.

14. The green LED 91 is set to indicate a passing relay test 170, and the test is stopped.

When determining if the electric terminal 23 connected with the armature 27 is in electrical contact with, for example, the normally-closed terminal 29, the analog-to-digital converters 140 convert a voltage drop across the terminals 23,29 to see if it reads substantially zero volts. However, due to contact wear and carbon build-up on contacts (not shown) in the relay 20, there may be a slight resistance across the terminals 23,29, in which case the voltage read at the normally-closed contact 29 may be slightly above zero volts. As such, a testing threshold voltage $V_c$ may be set such that resistances over a particular value result in a failed test, as though the terminals 23,29 are not in electrical contact even though they are, but for the contact carbon build-up.

While a particular form of the invention has been illustrated and described, it will be apparent that various modifications can be made without departing from the spirit and scope of the invention. For example, the shape of the enclosure 40 and circuit board 50 may be different than as shown in the figures. Accordingly, it is not intended that the invention be limited, except as by the appended claims.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

What is claimed is:

1. A testing device for a relay having a plurality of electric terminals, the testing device comprising:
   an enclosure;
   a circuit board fixed at least partially within the enclosure and including a testing circuit that includes a controller, two or more electronic switch components, a power source, at least one indicator, a test start switch, a relay selector switch connected with the testing circuit, the relay selector switch causing a relay type indicator to toggle between indicating a 4-prong relay and a 5-prong relay, the circuit further including five electric leads each terminating at a distal end thereof with an electrically-conducting clip, and at least five voltage dividers and five analog-to-digital converters;
   the testing circuit providing power to each of the leads and adapted to connect each of the five leads to ground in turn and measure the voltage between any two of the leads;
   the controller being adapted either to perform a quick count of the number of leads that are grounded as a result of setting one of the leads to ground before the relay coil can change state, or to perform a slow count of the number of leads that are grounded as a result of setting one of the leads to ground after an armature movement time wherein the relay coil fully changes state;
   whereby with each electric terminal of the relay connected to one of the leads of the testing circuit, and with the relay selector switch set to indicate the type of relay being tested, and with the test start switch actuated, the controller can set each lead to ground and then count the number of other leads that are grounded as a result, the controller illuminating the at least one indicator to indicate a passing relay test or a failed relay test based on the counts measured.

2. The testing device of claim 1 wherein the testing circuit further includes a voltage regulator for providing a component voltage to the testing circuit when the power source is a higher voltage than the component voltage.

3. The testing device of claim 2 wherein the component voltage is substantially 5 volts.

4. The testing device of claim 1 wherein the at least one indicator includes a green LED to indicate the passing relay test, and a red LED to indicate the failed relay test.

5. The testing device of claim 4 wherein the at least one indicator includes a 4-terminal LED for indicating that the relay is a 4-terminal relay, and wherein the at least one indicator includes a 5-terminal LED for indicating that the relay is a 5-terminal relay.

6. The testing device of claim 1 wherein the power source is a battery contained within the enclosure, the enclosure being selectively sealable to retain the battery therein.

7. The testing device of claim 1 wherein the power source is an external power source and wherein the testing circuit includes a positive power lead connected with the testing circuit and a negative power lead connected with the testing circuit, the positive power lead and the negative power lead requiring connection with the external power source before testing of the relay.

8. The testing device of claim 1 wherein the controller is adapted to run a predefined number of cyclic relay tests once the controller has determined which of the electric leads are connected with a relay coil of the relay, whereby the controller illuminating the at least one indicator to indicate the passing relay test or the failed relay test based on the results of the cyclic relay tests.

9. A method of testing a relay having a plurality of electric terminals, the method comprising the following steps:
   providing an enclosure; a circuit board fixed at least partially within the enclosure and including a testing circuit that includes a controller, two or more electronic switch components, a power source, at least one indicator, a test start switch, a relay selector switch connected with the testing circuit, the relay selector switch toggling between indicating a 4-terminal relay and a 5-terminal relay, the circuit further including five electric leads each terminating at a distal end thereof with an electrically-conducting clip, and at least five voltage dividers and five analog-to-digital converters; the testing circuit providing power to each of the leads and adapted to connect each of the five leads to ground in turn and measure the voltage between any two of the leads; the controller being adapted either to perform a quick count of the number of leads that are grounded as a result of setting one of the leads to ground before a relay coil of the relay can change state, or to perform a slow count of the number of leads that are grounded as a result of setting one of the leads to ground after the relay coil changes state;
   connecting each electric terminal of the relay to one of the five electric leads of the testing circuit, setting the relay selector switch to the type of relay being tested, and actuating the test start switch;
   the testing circuit testing to ensure the voltage of the power source is within a proper voltage range, and if not setting the at least one indicator to indicate lack of a proper input power source and stopping the test;
   connecting each of the electric leads with the power source
   if the relay selector switch is set to indicate a 4-terminal relay, performing a 4-terminal relay test with the following steps:
      a1) performing a first testing round by grounding a first of the electric leads and waiting for at least a predetermined armature movement time;
      b1) grounding each of the other electric leads in turn and performing the quick count of the number of leads that are grounded, and adding each count to determine if the count is ten, and if so skipping to step d1);
      c1) repeating from step a1) with a next testing round by grounding the next of the electric leads;
      d1) if none of the testing rounds results in a count of ten, the testing circuit setting the at least one indicator to indicate a failed relay test and stopping the test;
      f1) setting the at least one indicator to indicate a passing relay test and stopping the test;
   if the relay selector switch is set to indicate a 5-terminal relay, performing a 5-terminal relay test with the following steps:
      a2) performing a normally-closed test by grounding a first of the electric leads and counting the number of leads that are grounded, and if two then skipping to step d2);
      b2) repeating the normally-closed test from step a2) by grounding the next of the electric leads;
      c2) if all leads have been tested in the normally-closed test but none of the counts was ever two, the testing circuit setting the at least one indicator to indicate a failed relay test and stopping the test;
      d2) assigning the two electric leads that that are grounded as the normally closed leads;
      e2) searching for the coil by grounding the remaining three electric leads that are not the normally closed leads by grounding each in turn and, after the armature movement time, testing to see if the normally closed leads are now open, and if so designating the grounded lead as a coil lead, and if any of the two remaining leads are connected to either of the normally closed leads, and if so designating the two connected leads as normally open leads, a common lead between the normally closed leads and the normally open leads being designated as an armature lead, and skipping to step h2;
      f2) the testing circuit setting the at least one indicator to indicate a failed relay test and stopping the test;
      h2) setting the at least one indicator to indicate a passing relay test and stopping the test.

10. The method of claim 9 further including the steps:
e1) performing a cyclic relay test a predetermined number of cycles, comprising the steps: deactivating the coil and setting the armature lead to ground, verifying that the voltage drop across the normally open leads is sufficiently close to infinite, or, in the case of a normally closed relay, that the voltage drop across the normally open leads is sufficiently close to zero, then activating the coil by setting one of the coil leads to ground and waiting the armature movement time, verifying that the voltage drop across the normally open leads is sufficiently close to zero, or, in the case of a normally closed relay, that the voltage drop across the normally closed leads is sufficiently close to infinite; whereby if any of the cyclic relay test cycles fail the testing circuit illuminating the at least one indicator to indicate a failed test and stopping the test; and
g2) performing a cyclic relay test a predetermined number of cycles, comprising the steps: deactivating the coil and setting the armature lead to ground, verifying that the voltage drop across the normally closed leads is sufficiently close to zero and that the voltage drop across the normally open leads is sufficiently close to infinite, activating the coil by setting one of the coil leads to ground and waiting the armature movement time, verifying that the voltage drop across the normally closed leads is sufficiently close to infinite and that the voltage drop across the normally open leads is sufficiently close to zero; whereby if any of the cyclic relay test cycles fail the testing circuit illuminating the at least one indicator to indicate a failed test and stopping the test.

* * * * *